United States Patent
Cai et al.

(10) Patent No.: US 9,543,411 B2
(45) Date of Patent: Jan. 10, 2017

(54) LATERAL DOUBLE DIFFUSION METAL-OXIDE-SEMICONDUCTOR (LDMOS) TRANSISTORS AND FABRICATION METHOD THEREOF

(71) Applicant: Semiconductor Manufacturing International (Shanghai) Corporation, Shanghai (CN)

(72) Inventors: Jian Xiang Cai, Shanghai (CN); Juilin Lu, Shanghai (CN); Ty Chiu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 92 days.

(21) Appl. No.: 14/061,179

(22) Filed: Oct. 23, 2013

(65) Prior Publication Data
US 2014/0361366 A1    Dec. 11, 2014

(30) Foreign Application Priority Data
Jun. 9, 2013    (CN) .......................... 2013 1 0231955

(51) Int. Cl.
| H01L 29/66 | (2006.01) |
| H01L 21/336 | (2006.01) |
| H01L 29/78 | (2006.01) |
| H01L 29/06 | (2006.01) |

(52) U.S. Cl.
CPC ..... *H01L 29/66659* (2013.01); *H01L 29/0653* (2013.01); *H01L 29/0692* (2013.01); *H01L 29/7835* (2013.01)

(58) Field of Classification Search
CPC ........................ H01L 29/7816; H01L 29/66681
USPC .......................................... 257/343; 438/286
See application file for complete search history.

(56) References Cited

U.S. PATENT DOCUMENTS

| 5,156,989 | A * | 10/1992 | Williams et al. ............. 438/206 |
| 6,150,697 | A * | 11/2000 | Teshigahara et al. ......... 257/347 |
| 6,855,985 | B2 * | 2/2005 | Williams .......... H01L 21/26513 257/338 |
| 2004/0097019 | A1 * | 5/2004 | de Fresart et al. .................. 438/140 |
| 2010/0102388 | A1 * | 4/2010 | Levin et al. .................. 257/343 |
| 2010/0133611 | A1 * | 6/2010 | Disney et al. ................ 257/335 |
| 2010/0213543 | A1 * | 8/2010 | Zhang ................. H01L 27/0922 257/335 |
| 2010/0314683 | A1 * | 12/2010 | Yanagi .......................... 257/339 |
| 2010/0320529 | A1 * | 12/2010 | Dong et al. ................... 257/327 |
| 2011/0079849 | A1 * | 4/2011 | Yan et al. ..................... 257/343 |

(Continued)

*Primary Examiner* — Matthew Landau
*Assistant Examiner* — Igwe U Anya
(74) *Attorney, Agent, or Firm* — Anova Law Group, PLLC

(57) ABSTRACT

A lateral double diffusion metal-oxide-semiconductor (LDMOS) transistor is provided. The LDMOS transistor includes a semiconductor substrate having a well region and a drain region in the well region. The LDMOS transistor also includes at least one drifting region in the well region and an annular source region in the drifting region surrounding the drain region. Further, the LDMOS transistor includes at least one annular isolation structure surrounding the drain region in the drifting region. Further, the LDMOS transistor also includes an annular gate dielectric layer on the well region and an annular gate on the annular gate dielectric layer.

19 Claims, 10 Drawing Sheets

(56) References Cited

U.S. PATENT DOCUMENTS

| | | | |
|---|---|---|---|
| 2011/0198690 A1* | 8/2011 | Hu et al. | 257/336 |
| 2012/0043608 A1* | 2/2012 | Yang et al. | 257/336 |
| 2012/0187483 A1* | 7/2012 | Yang et al. | 257/336 |
| 2012/0205738 A1* | 8/2012 | Yang | H01L 29/66689 257/335 |
| 2013/0093015 A1* | 4/2013 | Pal | H01L 29/165 257/339 |
| 2013/0270606 A1* | 10/2013 | Chen | H01L 29/7835 257/183 |
| 2013/0292764 A1* | 11/2013 | Yang | H01L 29/063 257/336 |
| 2014/0001545 A1* | 1/2014 | Yang | H01L 29/66689 257/337 |

* cited by examiner

US 9,543,411 B2

LATERAL DOUBLE DIFFUSION METAL-OXIDE-SEMICONDUCTOR (LDMOS) TRANSISTORS AND FABRICATION METHOD THEREOF

CROSS-REFERENCES TO RELATED APPLICATIONS

This application claims the priority of Chinese patent application No. 201310231955.3, filed on Jun. 9, 2013, the entirety of which is incorporated herein by reference.

FIELD OF THE INVENTION

The present invention generally relates to the field of semiconductor technology and, more particularly, relates to lateral double diffusion metal-oxide-semiconductor (LDMOS) transistors and fabrication techniques thereof.

BACKGROUND

Due to their high breakdown voltage and compatibility with CMOS processes, lateral double diffusion metal-oxide-semiconductor (LDMOS) transistors have been widely used in power electronic devices. Comparing with a conventional CMOS device, an LDMOS transistor may have a relatively long drifting region between the source region and the drain region. The relatively long drifting region may be used to withstand a voltage drop when the LDMOS transistor is connected with a high voltage, and a high breakdown voltage may be obtained.

FIG. 1 illustrates an existing N-type LDMOS transistor. As shown in FIG. 1, the LDMOS transistor includes a P-type substrate 11, a P-type well region 12 in the substrate 11, a dielectric layer 16 on the well region 12, a gate 17 on the dielectric layer 16 and a sidewall spacer 18 around the dielectric layer 16 and the gate 17.

The LDMOS transistor also includes a drifting region 13 at one side of the gate 17 and a drain region 151 in the drifting region 13. The drifting region 13 and the gate 17 partially overlap along a direction vertical to the substrate 11.

Further, the LDMOS transistor includes an isolation structure 14 in the drifting region 13. The drain region 151 is at the outer side of the isolation structure 14. The isolation structure 14 and the gate 17 partially overlap along a direction vertical to the substrate 11. The overlap part of the isolation structure 14 and the gate 17 is smaller than the overlap part of the drifting region 13 and the gate 17.

Referring to FIG. 1, when the LDMOS transistor is turned on, a voltage may be applied between the drain region 151 and a source region 152, a current may flow from the source region 152 to the drain region 151 through the P-type well region 12 and the drifting region 13, and the current may accumulate in the drain region 151. Because of the existence of the isolation structure 14, an electric field distribution in the drifting region 13 may be changed such that the isolation structure 14 may withstand a relatively high electric field. Thus, a relatively high breakdown voltage may be obtained.

However, the existing LDMOS transistor may occupy a relatively large area of a chip. The disclosed methods, device structures and systems are directed to solve one or more problems set forth above and other problems.

BRIEF SUMMARY OF THE DISCLOSURE

One aspect of the present disclosure includes a lateral double diffusion metal-oxide-semiconductor (LDMOS) transistor. The LDMOS transistor includes a semiconductor substrate having well region and at least one drifting region in the well region. The LDMOS transistor also includes a drain region in the drifting region and an annular gate dielectric layer on the semiconductor substrate. Further, the LDMOS transistor includes an annular gate on the annular gate dielectric layer and an annular source region in the well region surrounding the drain region. Further, the LDMOS transistor also includes at least one annular isolation structure in the drifting region surrounding the drain region.

Another aspect of the present disclosure includes another LDMOS transistor. The LDMOS transistor includes a semiconductor substrate having a well region and at least one drifting region in the well region. The LDMOS transistor also includes a source region in the well region and an annular gate dielectric layer on the well region. Further, the LDMOS transistor includes an annular gate on the annular gate dielectric layer and an annular drain region in the well region surrounding the source region. Further, the LDMOS transistor also includes at least one annular isolation structure in the drifting region surrounding the source region.

Another aspect of the present disclosure includes a method for fabricating a LDMOS transistor. The method includes providing a semiconductor substrate; and forming a well region in the semiconductor substrate. The method also includes forming at least one annular isolation structure and at least one drifting region in the well region; and forming an annular gate dielectric layer on the well region. Further, the method includes forming an annular gate on the annular gate dielectric layer; and forming a source region and a drain region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 27:
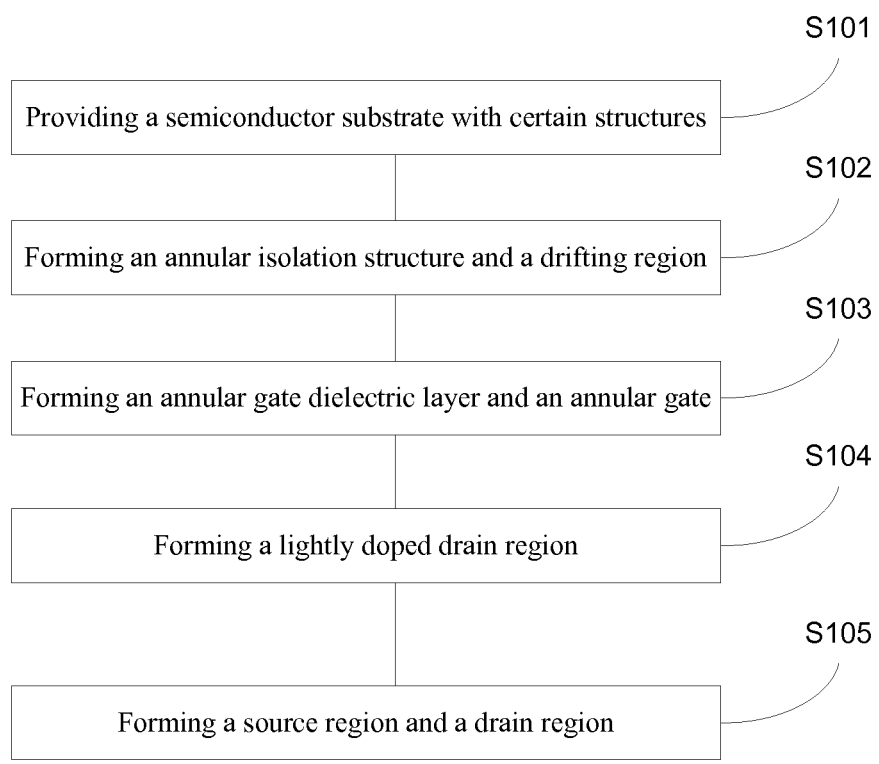
FIG. 27 illustrates an exemplary fabrication process of an LDMOS transistor consistent with the disclosed embodiments.

FIG. 27 illustrates an exemplary fabrication process of a LDMOS transistor consistent with the disclosed embodiments; FIGS. 2, 4, 6 and 8 illustrate semiconductor structures corresponding to certain stages of the exemplary fabrication process; and FIGS. 3, 5, 7 and 9 illustrate cross-section views of FIGS. 2, 4, 6 and 8 along the A-A direction.

Figure 1:
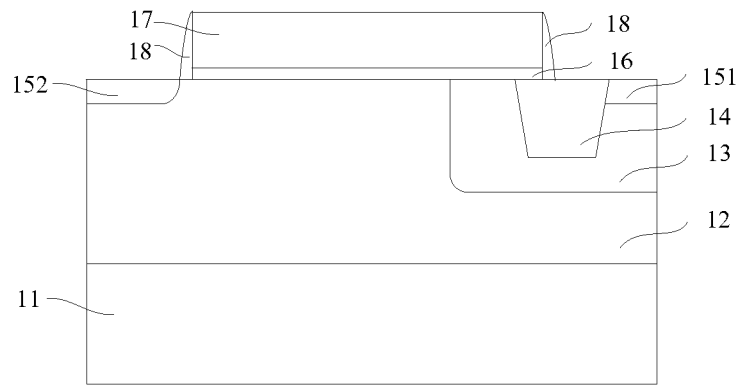
FIG. 1 illustrates an existing LDMOS transistor.
Figure 2:
FIGS. 2, 4, 6 and 8 illustrate semiconductor structures corresponding to certain stages of an exemplary fabrication process of an LDMOS transistor consistent with the disclosed embodiments.

As shown in FIG. 27, at the beginning of the fabrication process, a semiconductor substrate with certain structures is provided (S101). FIG. 2 illustrates a corresponding semiconductor structure; and FIG. 3 illustrates a cross-section view of the semiconductor structure shown in FIG. 2 along the A-A direction.

Figure 3:
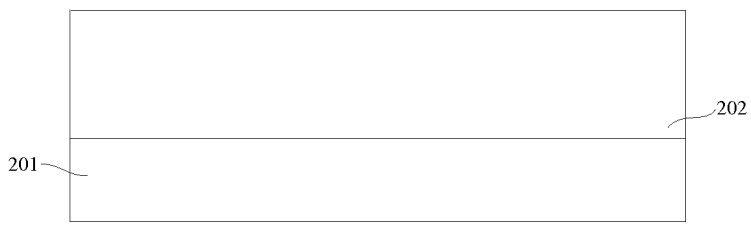
FIGS. 3, 5, 7 and 9 illustrate cross-section views of FIGS. 2, 4, 6 and 8 along the A-A direction.

As shown in FIG. 2 and FIG. 3, a semiconductor substrate 201 is provided. The semiconductor substrate 201 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 201 may also provide a base for subsequent processes and structures.

After providing the semiconductor substrate 201, a well region 202 may be formed in the semiconductor substrate 201. The well region 202 may be made of any appropriate material, which may be same as the semiconductor substrate 201, or may be different from the semiconductor substrate 201. If the semiconductor substrate 201 is used to subsequently form N-type LDMOS transistors, the semiconductor substrate 201 may be doped with P-type ions, and the well region 202 may be doped with P-type ions too. If the semiconductor substrate 201 is used to subsequently form P-type LDMOS transistors, the semiconductor substrate 201 may be doped with N-type ions, and the well region 202 may be doped with N-type ions as well. The well region 202 may be formed by any appropriate process, such as an ion implantation process, or an embedding process, etc.

Figure 4:
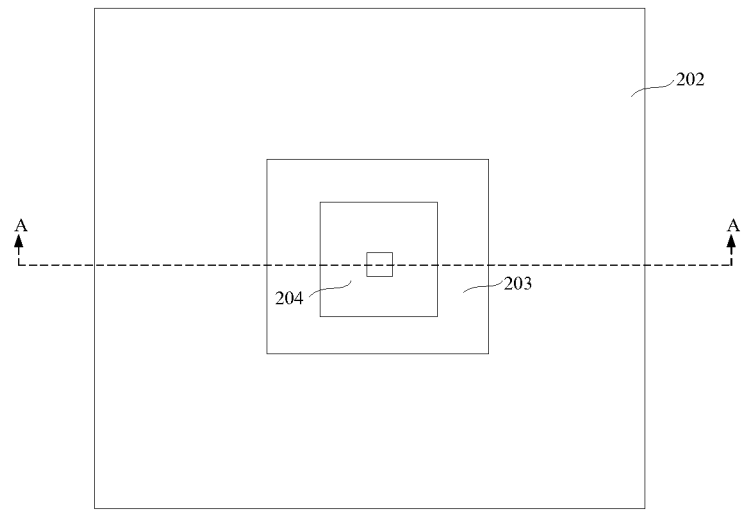

Returning to FIG. 27, after providing the semiconductor substrate 201 with the well region 202, an annular isolation structure and a drifting region may be formed in the well region 202 (S102). FIG. 4 illustrates a corresponding semiconductor structure; and FIG. 5 illustrate a cross-section view of the semiconductor structure shown in FIG. 4 along the A-A direction.

Figure 5:
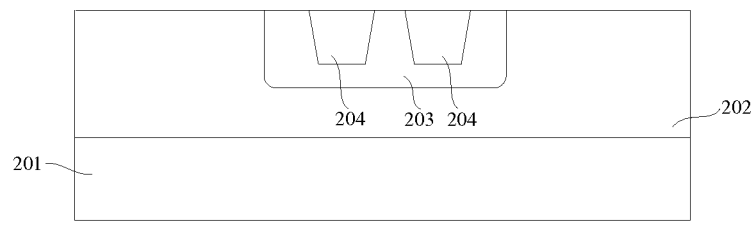

As shown in FIG. 4 and FIG. 5, a drifting region 203 and an annular isolation structure 204 are formed in the well region 202; and the annular isolation structure 204 is formed in the drifting region 203. In one embodiment, the drifting region 203 may be formed in the well region 202 firstly, and then the annular isolation structure 204 may be formed in the drifting region 203. In certain other embodiments, the annular isolation structure 204 may be formed firstly, and then the drifting region 203 may be formed. A doping type of the drifting region 203 may be opposite to a doping type of the well region 202. That is, if the well region 202 is N-type doped, the drifting region 203 may be doped with P-type ions; if the well region 202 is P-type doped, the drifting region 203 may be doped with N-type ions.

The drifting region 203 may be made of a same material as the well region 202 but doped with opposite doping ions. Thus, the drifting region 203 may be formed by an ion implantation process, or other appropriate processes. The drifting region 203 may also be made of a material different from the well region 202. Thus, the drifting region 203 may be formed by an embedding method. That is, the drifting region 203 is embedded in the well region 202 by any appropriate process.

The annular isolation structure 204 may be any appropriate structure. In one embodiment, the annular isolation structure 204 is a shallow trench isolation (STI) structure. The annular isolation structure 204 may also be a field oxidation isolation structure. The annular isolation structure 204 may be made of any appropriate material, such as silicon oxide, silicon nitride, or silicon oxynitride, etc. Various processes may be used to form the annular isolation structure 204, such as an ion implantation process, or an embedding process, etc.

In certain other embodiments, the annular isolation structure 204 may be two or more. Two or more annular isolation structures 204 may alternately loop together. The most inner one of the two or more isolation annular structures 204 may surround a subsequently formed drain region. The most outer one of the two or more annular isolation structures 204 may have an overlap with the inner portion of a subsequently formed annular gate 207 along a direction vertical to the surface of the semiconductor substrate 201. The two or more annular isolation structures 204 may increase the breakdown voltage of the LDMOS transistor.

Figure 6:
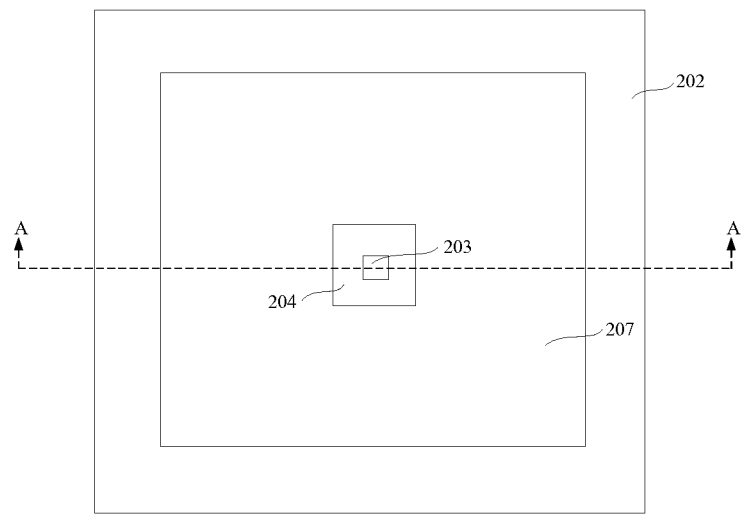

Returning to FIG. 27, after forming the drifting region 203 and the annular isolation region 204, an annular gate dielectric layer and an annular gate may be formed (S103). FIG. 6 illustrates a corresponding semiconductor structure; and FIG. 7 illustrates a cross-section view of the semiconductor structure shown in FIG. 6 along the A-A direction.

Figure 7:
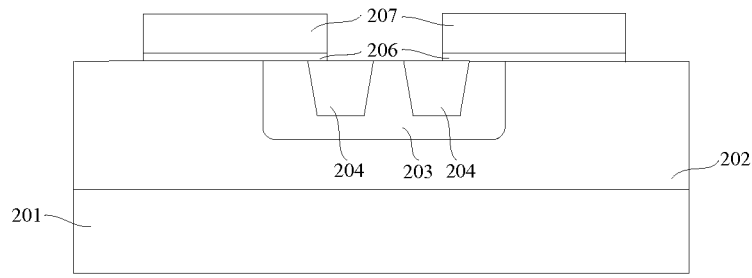

As shown in FIG. 6 and FIG. 7, an annular gate dielectric layer 206 is formed on the well region 202; and an annular gate 207 is formed on the annular gate dielectric layer 206. The annular isolation structure 204 may locate in drifting region 203 at the inner side of the annular gate 207. An annular overlap may be formed between the inner side of the annular gate 207 and the annular isolation structure 204 along a direction vertical to the surface of the semiconductor substrate 201. An annular overlap may also be formed between the inner side of the annular gate 207 and the drifting region 203 along a direction vertical to the surface of the semiconductor substrate 201.

The annular gate dielectric layer 206 and the annular gate 207 may be formed by forming a gate dielectric material layer on the well region 202; forming a gate material layer on the gate dielectric material layer; forming a patterned mask layer on the gate material layer to define positions of the annular gate dielectric layer 206 and the gate 207; and etching the gate material layer and the gate dielectric material layer using the patterned mask as an etching mask.

The gate dielectric material layer may be made of any appropriate material, such as $SiO_2$, $HfO_2$, or $ZrO$ etc. In one embodiment, the gate dielectric material layer is $SiO_2$. Various processes may be used to form the gate dielectric material layer, such as a chemical vapor deposition (CVD) process, a physical vapor deposition (PVD) process, and an atomic layer deposition (ALD) process, etc.

The gate material layer may be made of any appropriate material, such as Au, Ti, Cu, Al, or poly silicon, etc. In one embodiment, the gate material layer is made of poly silicon. Various processes may be used to form the gate material layer, such as a CVD process, a PVD process, or an ALD process, etc.

The gate dielectric material layer and the gate material layer may be etched by any appropriate process, such as a dry etching process, or a wet etching process, etc.

Figure 8:
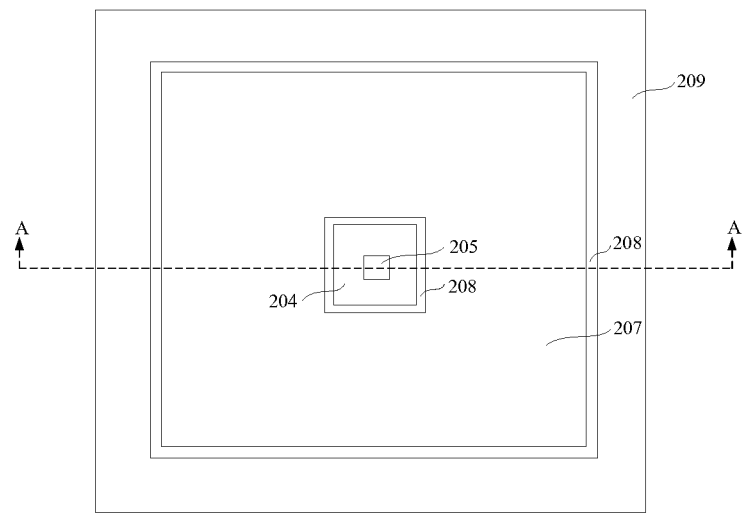

Returning to FIG. 27, after forming the annular gate dielectric layer 206 and the annular gate 207, a lightly doped region may be formed (S104). FIG. 8 illustrates a corresponding semiconductor structure; and FIG. 9 illustrates a cross-section view of the semiconductor structure illustrated in FIG. 8 along the A-A direction.

Figure 9:
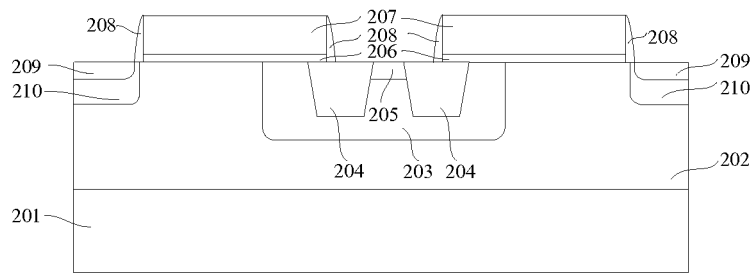

As shown in FIG. 9, an annular lightly doped region 210 is formed in the well region 202 at the outer side of the annular gate 207. The annular lightly doped region 210 may reduce the breakdown point of an avalanche effect of an LDMOS transistor, thus the breakdown voltage may be reduced.

In one embodiment, the annular lightly doped region 210 may be formed by forming a hard mask layer (not shown) exposing a portion of the well region 202 at the outer side of the annular gate 207 on the annular gate 207 and the semiconductor substrate 201; and forming the annular lightly doped region 210 by an ion implantation process onto the portion of the well region 202 at the outer side of the annular gate 207. When the semiconductor substrate 201 is used to form N-type LDMOS transistors, the annular lightly doped region 210 may be doped with N-type ions. When the semiconductor substrate 201 is used to form P-type LDMOS transistors, the annular lightly doped region 210 may be doped with P-type ions.

In certain other embodiments, the annular lightly doped region 210 may be omitted.

Referring to FIG. 9, after forming the annular lightly doped region 210, sidewall spacers 208 may be formed on the side surfaces of the annular gate 207 and the annular gate dielectric layer 206. The sidewall spacers 208 at the outer side of the annular gate 207 and the annular gate dielectric layer 206 and the annular lightly doped region 210 may have an annular overlap along a direction vertical to the surface of the semiconductor substrate 201.

Various processes may be used to form the sidewall spacers 208, in one embodiment, the sidewall spacers 208 may be formed by forming a sidewall spacer material layer on the semiconductor substrate 201 and the annular gate 207, and around the annular gate 207 and the annular gate dielectric layer 206; and performing an etch back process to remove the sidewall spacer material layer on the semiconductor substrate 201 and the annular gate 207. Thus, the sidewall spacers 208 on the side surfaces of the annular gate 207 and the annular gate dielectric layer 206 may be formed.

The sidewall spacer material layer may be made of any appropriate material, such as silicon oxide, silicon nitride, or silicon oxynitride, etc. The sidewall spacers 208 may also be stacked layers made of different materials. Various processes may be used to form the sidewall spacer material layer, such as a CVD process, a PVD process, or an ALD process, etc. The etch back process may be a dry etching process, or a wet chemical etching process, etc.

Returning to FIG. 27, after forming the sidewall spacers 208, a source region and a drain region may be formed (S105). FIG. 8 illustrates a corresponding semiconductor structure; and FIG. 9 illustrates a cross-section view of the semiconductor structure illustrated in FIG. 8 along the A-A direction.

As shown in FIG. 8 and FIG. 9, an annular source region 209 is formed in the annular lightly doped region 210, and a drain region 205 is formed in drifting region 203 at the inner side of the isolation structure 204. Referring to FIG. 9, a depth of the source region 209 may be smaller than a depth of the annular lightly doped region 210. The annular source region 209 and the drain region 205 may be formed by any appropriate process, such as an ion implantation process, or an embedding method, etc.

Thus, the LDMOS transistor may include an annular gate 207, a drain region 205 in drafting region 203 at the inner side of the annular gate 207, and an annular source region 209 in the lightly doped region 210 at outer side of the annular gate 207. An annular channel may be formed between the drain region 205 and the annular source region 209. The annular gate 207 may control the annular channel from different directions, thus the LDMOS transistor may have an enhanced channel control ability. Therefore, a short-channel effect may be effectively reduced, and the drive current may be increased. Further, the LDMOS transistor may occupy less area of a chip under a same drive current, thus the production cost may be reduced.

Thus, a LDMOS transistor may be formed by the above disclosed processes and methods, the corresponding transistor is illustrated in FIG. 8; and FIG. 9 illustrates a cross-section view of the LDMOS transistor shown in FIG. 8. The LDMOS transistor includes a semiconductor substrate 201 having a well region 202 and a drifting region 203 in the well region 202. The LDMOS transistor also includes a drain region 205 in the drifting region 203 and an annular isolation structure 204 surrounding the drain region 205. Further, the LDMOS transistor includes an annular gate dielectric layer 206 on the well region 202 and an annular gate 207 on an annular gate dielectric layer 206. Further, the LDMOS transistor also includes sidewall spacers 208 around the annular gate dielectric layer 206 and the annular gate 207, and an annular source region 209 in a lightly doped region 210 at the outer side of the sidewall spacers 208. The detailed structures and intermediate structures are described above with respect to the fabrication methods.

FIGS. 10, 12, 14 and 16 illustrate semiconductor structures corresponding to certain stages of the exemplary fabrication process of another LDMOS transistor; and FIGS. 11, 13, 15 and 17 illustrate cross-section views of FIGS. 10, 12, 14 and 16 along the B-B direction. For illustrated purposes, the exemplary fabrication process shown in FIG. 27 is still used to make the LDMOS transistor.

Figure 10:
FIGS. 10, 12, 14 and 16 illustrate semiconductor structures corresponding to certain stages of the exemplary fabrication process of another LDMOS transistor consistent with the disclosed embodiments.

As shown in FIG. 27, at the beginning of the fabrication process, a semiconductor substrate with certain structures is provided (S101). FIG. 10 illustrates a corresponding semiconductor structure; and FIG. 11 illustrates a cross-section view of the semiconductor structure shown in FIG. 10 along the B-B direction.

Figure 11:
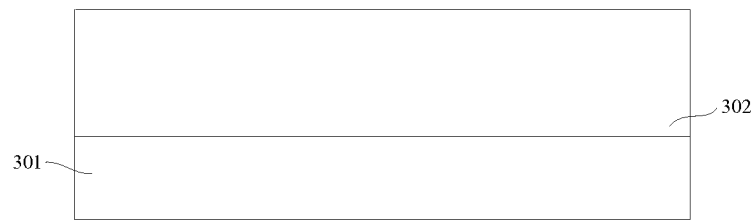
FIGS. 11, 13, 15 and 17 illustrate cross-section views of FIGS. 10, 12, 14 and 16 along the B-B direction.

As shown in FIG. 10 and FIG. 11, a semiconductor substrate 301 is provided. The semiconductor substrate 301 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 301 may also provide a base for subsequent processes and structures.

After providing the semiconductor substrate 301, a well region 302 may be formed in the semiconductor substrate 301. The well region 302 may be made of any appropriate material, which may be same as the semiconductor substrate 301, or different from the semiconductor substrate 301. If the semiconductor substrate 301 is used to subsequently form N-type LDMOS transistors, the semiconductor substrate 301 may be doped with P-type ions, and the well region 302 may be doped with P-type ions too. If the semiconductor substrate 301 is used to subsequently form P-type LDMOS transistors, the semiconductor substrate 301 may be doped with N-type ions, and the well region 302 may be doped with N-type ions as well. The well region 302 may be formed by any appropriate process, such as an ion implantation process, or an embedding process, etc.

Figure 12:
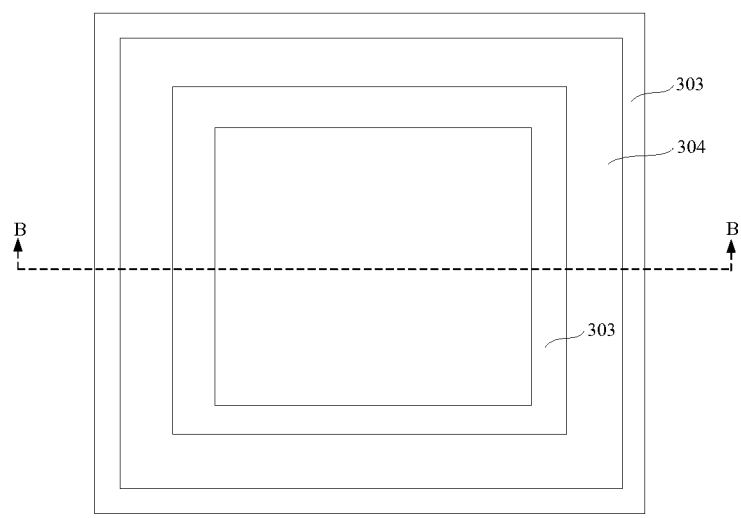

Returning to FIG. 27, after providing the semiconductor substrate 301 with the well region 302, an annular isolation structure and an annular drifting region may be formed in the well region 302 (S102). FIG. 12 illustrates a corresponding semiconductor structure; and FIG. 13 illustrates a cross-section view of the semiconductor structure shown in FIG. 12 along the B-B direction.

Figure 13:
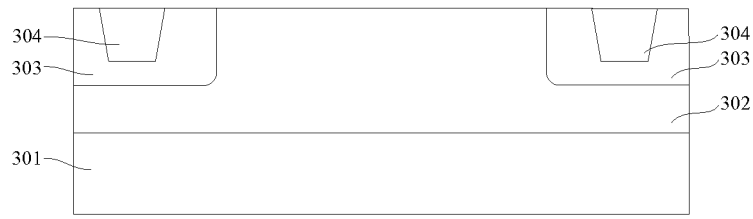

As shown in FIG. 12 and FIG. 13, an annular drifting region 303 and an annular isolation structure 304 are formed in the well region 302; and the annular isolation structure 304 is formed in the annular drifting region 303. In one embodiment, the annular drifting region 203 may be formed in the well region 302 firstly, and then the annular isolation structure 304 may be formed in the annular drifting region 303. In certain other embodiments, the annular isolation structure 304 may be formed firstly, and then the annular drifting region 303 may be formed. A doping type of the annular drifting region 303 may be opposite to a doping type of the well region 302. That is, if the well region 302 is N-type doped, the annular drifting region 303 may be doped with P-type ions; if the well region 302 is P-type doped, the annular drifting region 303 may be doped with N-type ions.

The annular drifting region 303 may be made of a same material as the well region 302 but doped with opposite doping ions. Thus, the annular drifting region 303 may be formed by an ion implantation process, or other appropriate processes. The annular drifting region 303 may also be made of a material different from the well region 302. Thus, the annular drifting region 303 may be formed by an embedding method. That is, the annular drifting region 303 is embedded in the well region 302 by any appropriate process.

The annular isolation structure 304 may be any appropriate structure. In one embodiment, the isolation structure 304 is a shallow trench isolation (STI) structure. The isolation structure 304 may also be a field oxidation isolation structure. The annular isolation structure 304 may be made of any appropriate material, such as silicon oxide, silicon nitride, or silicon oxynitride, etc. Various processes may be used to form the annular isolation structure 304, such as an ion implantation process, or an embedding process, etc.

In certain other embodiments, the annular isolation structure 304 may be two or more. Two or more annular isolation structures 304 may alternately loop together. The most inner one of the two or more annular isolation structures 304 may overlap with the outer edge of a subsequently formed annular gate along a direction vertical to the surface of the semiconductor substrate 301. A subsequently formed drain region may surround the most outer one of the two or more annular isolation structures 304. The two or more annular isolation structures 304 may increase the breakdown voltage of the LDMOS transistor.

Figure 14:
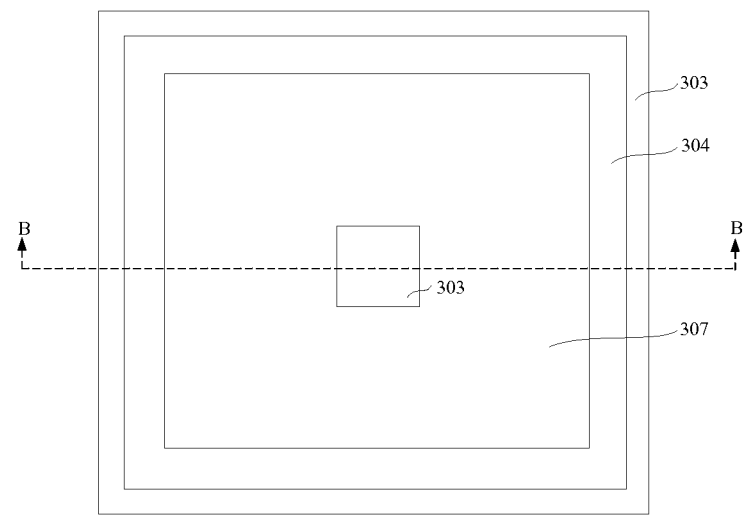

Returning to FIG. 27, after forming the annular drifting region 303 and the annular isolation region 304, an annular gate dielectric layer and an annular gate may be formed (S103). FIG. 14 illustrates a corresponding semiconductor structure; and FIG. 15 illustrates a cross-section view of the semiconductor structure shown in FIG. 14 along the B-B direction.

Figure 15:
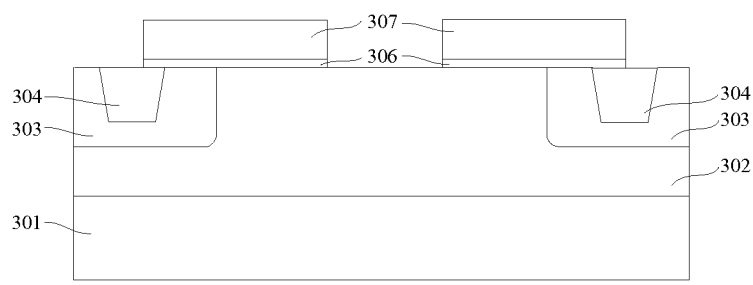

As shown in FIG. 14 and FIG. 15, an annular gate dielectric layer 306 is formed on the well region 302, and an annular gate 307 is formed on the annular gate dielectric layer 306. The annular isolation structure 304 may be in the annular drifting region 303 at the outer side of the annular gate 307. An annular overlap may be formed between the outer side of the annular gate 307 and the annular isolation structure 304 along a direction vertical to the surface of the semiconductor substrate 301. An annular overlap may also be formed between the outer side of the annular gate 307 and the annular drifting region 303 along a direction vertical to the surface of the semiconductor substrate 301.

The annular gate dielectric layer 306 and the annular gate 307 may be formed by forming a gate dielectric material layer on the well region 302; forming a gate material layer on the gate dielectric material layer; forming a patterned mask layer on the gate material layer to define positions of the annular gate dielectric layer 306 and the gate 307; and etching the gate material layer and the gate dielectric material layer using the patterned mask as an etching mask.

The gate dielectric material layer may be made of any appropriate material, such as $SiO_2$, $HfO_2$, or $ZrO$ etc. In one embodiment, the gate dielectric material layer is $SiO_2$. Various processes may be used to form the gate dielectric material layer, such as a chemical vapor deposition (CVD) process, a physical vapor deposition process, and an atomic layer deposition (ALD) process, etc.

The gate material layer may be made of any appropriate material, such as Au, Ti, Cu, Al, or poly silicon, etc. In one embodiment, the gate material layer is made of poly silicon. Various processes may be used to form the gate material layer, such as a CVD process, a PVD process, or an ALD process, etc.

The gate dielectric material layer and the gate material layer may be etched by any appropriate process, such as a dry etching process, or a wet etching process, etc.

Figure 16:
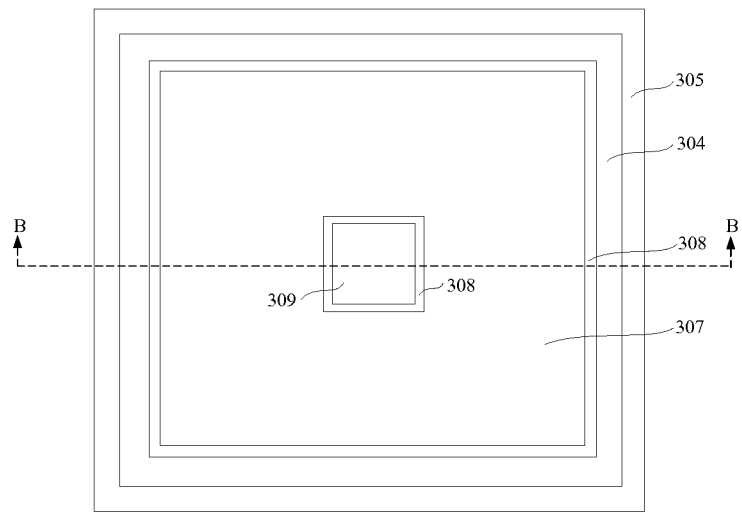

Returning to FIG. 27, after forming the annular gate dielectric layer 206 and the annular gate 207, a lightly doped region may be formed (S104). FIG. 16 illustrates a corresponding semiconductor structure; and FIG. 17 illustrates a cross-section view of the semiconductor structure illustrated in FIG. 16 along the B-B direction.

Figure 17:
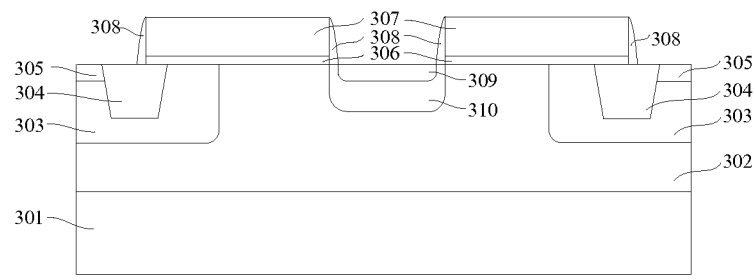

As shown in FIG. 17, a lightly doped region 310 is formed in the well region 302 at the inner side of the annular gate 307. The lightly doped region 310 may reduce the breakdown point of an avalanche effect of a LDMOS transistor, thus the breakdown voltage may be reduced.

In one embodiment, the lightly doped region 310 may be formed by forming a hard mask layer (not shown) exposing a portion of the well region 302 at the inner side of the annular gate 307; and forming the lightly doped region 310 by an ion implantation process onto the portion of the well region 302 at the inner side of the annular gate 307. When the semiconductor substrate 301 is used to form N-type LDMOS transistors, the lightly doped region 310 may be doped with N-type ions. When the semiconductor substrate 301 is used to form P-type LDMOS transistors, the lightly doped region 310 may be doped with P-type ions.

In certain other embodiments, the lightly doped region 310 may be omitted.

Referring to FIG. 17, after forming the lightly doped region 310, sidewall spacers 308 may be formed on the side surfaces of the annular gate 307 and the annular gate dielectric layer 306. The sidewall spacers 308 at the inner sides of the annular gate 307 and the lightly doped region 310 may have an annular overlap along a direction vertical to the surface of the semiconductor substrate 301.

Various processes may be used to form the sidewall spacers 308, in one embodiment, the sidewall spacers 308 may be formed by forming a sidewall spacer material layer on the semiconductor substrate 301 and the annular gate 307, and around the annular gate 307 and the annular gate dielectric layer 306; and performing an etch back process to remove the sidewall spacer material layer on the semiconductor substrate 301 and the annular gate 307. Thus, the sidewall spacers 308 on the side surfaces of the annular gate 307 and the annular gate dielectric layer 306 may be formed.

The sidewall spacer material layer may be made of any appropriate material, such as silicon oxide, silicon nitride, or silicon oxynitride, etc. The sidewall spacers 308 may also be stacked layers made of different materials. Various processes may be used to form the sidewall spacer material layer, such as a CVD process, a PVD process, or an ALD process, etc. The etch back process may be a dry etching process, or a wet chemical etching process, etc.

Returning to FIG. 27, after forming the sidewall spacer 308, a source region and a drain region may be formed (S105). FIG. 16 illustrates a corresponding semiconductor structure; and FIG. 17 illustrates a cross-section view of the semiconductor structure illustrated in FIG. 16 along the B-B direction.

As shown in FIG. 16 and FIG. 17, a source region 309 is formed in the lightly doped region 310, and a drain region 305 is formed in the well region 302 at the outer side of the isolation structure 304. Thus, the drain region 305 is an annular shape. Referring to FIG. 17, a depth of the source region 309 may be smaller than a depth of the lightly doped region 310. The source region 309 and the annular drain region 305 may be formed by any appropriate process, such as an ion implantation process, or an embedding method, etc.

The LDMOS transistor may include an annular gate 307, a source region 309 in the lightly doped region 310 at the inner side of the annular gate 307, and an annular drain region 305 in the drifting region 303 at the outer side of an annular isolation structure 304. An annular channel may be formed between the source region 309 and the annular drain region 305. The annular gate 307 may control the annular channel from different directions, thus the LDMOS transistor may have an enhanced channel control ability. Therefore, a short-channel effect may be effectively reduced, and the drive current may be increased. Further, the LDMOS transistor may occupy less area of a chip under a same drive current, thus the production cost may be reduced.

Thus, a LDMOS transistor may be formed by the above disclosed processes and methods, the corresponding LDMOS transistor is illustrated in FIG. 16; and FIG. 17 illustrates a cross-section view of the LDMOS transistor shown in FIG. 16. The LDMOS transistor includes a semiconductor substrate 301 having a well region 302 and an annular drifting region 303 in the well region 302. The LDMOS transistor also includes a source region 309 in a lightly doped drain region 310, and an annular gate dielectric layer 306 and an annular gate 307 surrounding the source region 309. Further, the LDMOS transistor includes an annular isolation structure 304 in the annular drifting region 303 at the outer side of the annular gate dielectric layer 306. Further, the LDMOS transistor also includes sidewall spacers 308 around the annular gate dielectric layer 306 and the annular gate 307, and an annular drain region 305 in the annular drifting region 303 at the outer side of the sidewall spacers 308. The detailed structures and intermediate structures are described above with respect to the fabrication methods.

FIGS. 18, 20, 22 and 24 illustrate semiconductor structures corresponding to certain stages of the exemplary fabrication process of another LDMOS transistor; and FIGS. 19, 21, 23 and 25 illustrate cross-section views of FIGS. 18, 20, 22 and 24 along the C-C direction. For illustrated purposes, the exemplary fabrication process shown in FIG. 27 is still used to make the LDMOS transistor.

Figure 18:
FIGS. 18, 20, 22 and 24 illustrate semiconductor structures corresponding to certain stages of the exemplary fabrication process of another LDMOS transistor consistent with the disclosed embodiments.

As shown in FIG. 27, at the beginning of the fabrication process, a semiconductor substrate with certain structures is provided (S101). FIG. 18 illustrates a corresponding semiconductor structure; and FIG. 19 illustrates a cross-section view of the semiconductor structure shown in FIG. 18 along the C-C direction.

Figure 19:
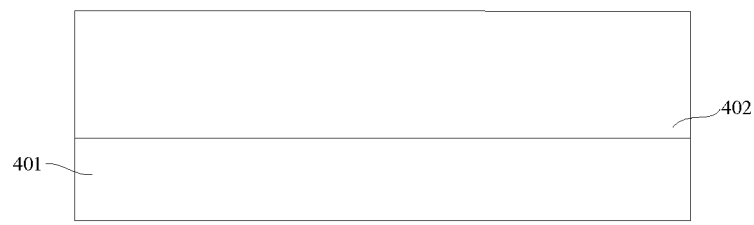
FIGS. 19, 21, 23 and 25 illustrate cross-section views of FIGS. 18, 20, 22 and 24 along the C-C direction.

As shown in FIG. 18 and FIG. 19, a semiconductor substrate 401 is provided. The semiconductor substrate 401 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 401 may also provide a base for subsequent processes and structures.

After providing the semiconductor substrate 401, a well region 402 may be formed in the semiconductor substrate 401. The well region 402 may be made of any appropriate material, which may be same as the semiconductor substrate 401, or different from the semiconductor substrate 401. If the semiconductor substrate 401 is used to subsequently form N-type LDMOS transistors, the semiconductor substrate 401 may be doped with P-type ions, and the well region 402 may be doped with P-type ions too. If the semiconductor substrate 301 is used to subsequently form P-type LDMOS transistors, the semiconductor substrate 401 may be doped with N-type ions, and the well region 402 may be doped with N-type ions as well. The well region 402 may be formed by any appropriate process, such as an ion implantation process, or an embedding process, etc.

Figure 20:
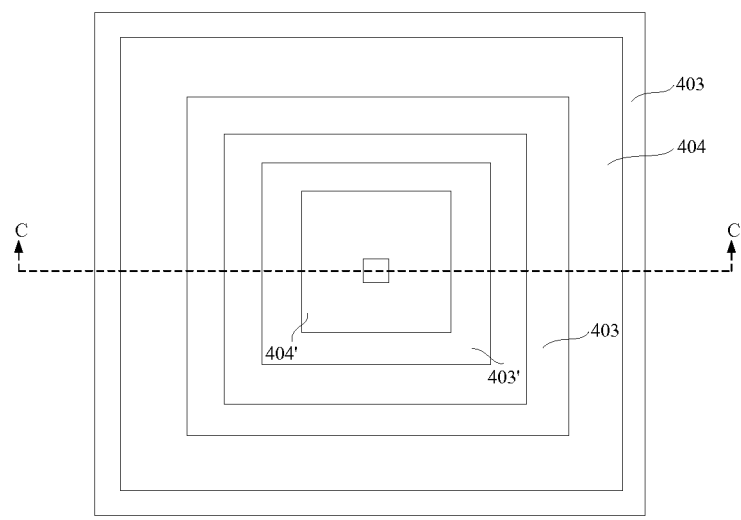

Returning to FIG. 27, after providing the semiconductor substrate 401 with the well region 402, a plurality of annular isolation structures and a plurality of drifting regions may be formed in the well region 402 (S102). FIG. 20 illustrates a corresponding semiconductor structure; and FIG. 21 illustrates a cross-section view of the semiconductor structure shown in FIG. 12 along the C-C direction.

Figure 21:
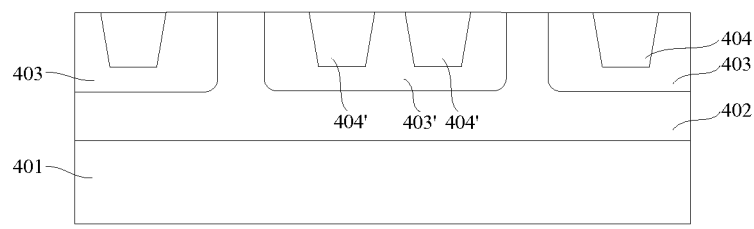

As shown in FIG. 20 and FIG. 21, at least one first annular isolation structure 404' and at least one second annular isolation structure 404 are formed in the well region 402. The second annular isolation structure 404 may surround the first annular isolation structure 404'. Further, a first drifting region 403' and a second drifting region 403 are also formed in the well region 402. The first annular isolation structure 404' may be in the first drifting region 403', and the second annular isolation structure 404 may be in the second drifting region 403. The second drifting region 403 may be an annular drifting region.

In one embodiment, the first drifting region 403' and the second drifting region 403 may be formed in the well region 402 firstly, and then the first annular isolation structure 404' and the second annular isolation structure 404 may be formed in the first drifting region 403' and the second drifting region 403, respectively. In certain other embodiments, the first annular isolation structure 404' and the second annular structure 404 may be formed firstly, and then the first drifting region 403' and the second drifting region 403 may be formed. A doping type of the first drifting region 403' and the second drifting region 403 may be opposite to a doping type of the well region 402. That is, if the well region 402 is N-type doped, the first drifting region 403' and the second drifting region 403 may be doped with P-type ions; if the well region 402 is P-type doped, the first drifting region 403' and the second drifting region 403 may be doped with N-type ions.

The first drifting region 403' and the second drifting region 403 may be made of a same material as the well region 402 but being doped with opposite doping ions. Thus, the first drifting region 403' and the second drifting region 403 may be formed by an ion implantation process, or other appropriate processes. The first drifting region 403' and the second drifting region 403 may also be made of a material different from the well region 402. Thus, the first drifting region 403' and the second drifting region 403 may be formed by an embedding method. That is, the first drifting region 403' and the second drifting region 403 are embedded in the well region 402 by any appropriate process.

The first annular isolation structure 404' and the second annular isolation structure 404 may be any appropriate structure. In one embodiment, the first isolation structure 404' and the second annular isolation structure 404 are shallow trench isolation (STI) structures. The first isolation structure 404' and the second isolation structure 404 may also be field oxidation isolation structures. The first annular isolation structure 404' and the second annular isolation structure 404 may be made of any appropriate material, such as silicon oxide, silicon nitride, or silicon oxynitride, etc. Various processes may be used to form the first annular isolation structure 404' and the second annular isolation structure 404, such as an ion implantation process, or an embedding process, etc.

In certain other embodiments, the first annular isolation structure 404' may be two or more. Two or more first annular isolation structures 404' may alternately loop together. The most outer one of the two or more first isolation structures 404' may partially overlap with the inner edge of a subsequently formed annular gate along a direction vertical to the surface of the semiconductor substrate 401. A drain region may be formed in the well region 402 at the inner side of the most inner one of the two or more first isolation structures 404'. A plurality of isolation structures may increase the breakdown voltage of the LDMOS transistor.

Figure 22:
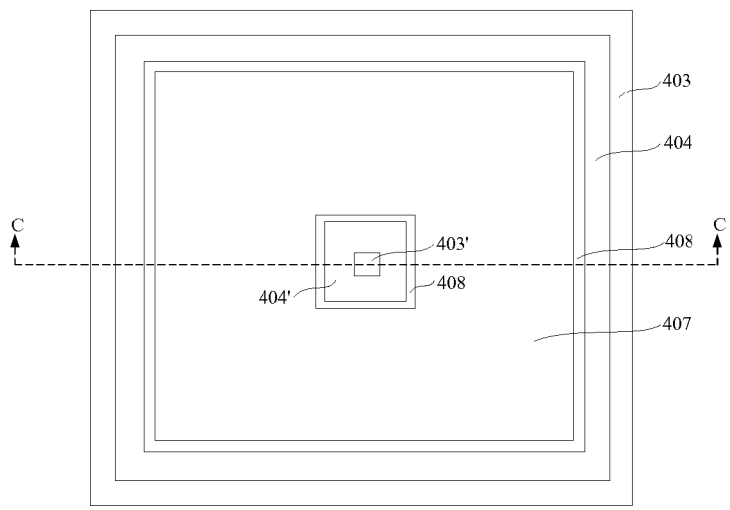

Returning to FIG. 27, after forming the first drifting region 403', the second drifting region 403, the first annular isolation structure 404' and the second annular isolation structure 404, an annular gate dielectric layer and an annular gate may be formed (S103). FIG. 22 illustrates a corresponding semiconductor structure; and FIG. 23 illustrates a cross-section view of the semiconductor structure shown in FIG. 22 along the C-C direction.

Figure 23:
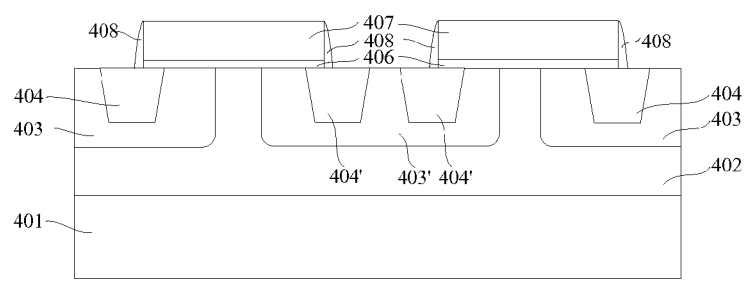

As shown in FIG. 22 and FIG. 23, an annular gate dielectric layer 406 is formed on the well region 402, and an annular gate 407 is formed on the annular gate dielectric layer 406. The first drifting region 403' and the first annular isolation structure 404' may be in the well region 402 the inner side of the annular gate 407. The inner side of the annular gate 707 may have an annular overlap with first drifting region 403' and the first annular isolation structure 404' along a direction vertical to the surface of the semiconductor substrate 401. The outer side of the annular gate 307 may have an annular overlap with the second drifting region 403 and the second annular isolation structure 403 along a direction vertical to the surface of the semiconductor substrate 401.

The annular gate dielectric layer 406 and the annular gate 407 may be formed by forming a gate dielectric material layer on the well region 402; forming a gate material layer on the gate dielectric material layer; forming a patterned mask layer on the gate material layer to define positions of the annular gate dielectric layer 406 and the gate 407; and etching the gate material layer and the gate dielectric material layer using the patterned mask as an etching mask.

The gate dielectric material layer may be made of any appropriate material, such as $SiO_2$, $HfO_2$, or $ZrO$ etc. In one embodiment, the gate dielectric material layer is $SiO_2$. Various processes may be used to form the gate dielectric material layer, such as a chemical vapor deposition (CVD) process, a physical vapor deposition (PVD) process, and an atomic layer deposition (ALD) process, etc.

The gate material layer may be made of any appropriate material, such as Au, Ti, Cu, Al, or poly silicon, etc. In one embodiment, the gate material layer is made of poly silicon. Various processes may be used to form the gate material layer, such as a CVD process, a PVD process, or an ALD process, etc.

The gate dielectric material layer and the gate material layer may be etched by any appropriate process, such as a dry etching process, or a wet etching process, etc.

Referring to FIG. 23, sidewall spacers 408 may be formed on the side surfaces of the annular gate 407 and the annular gate dielectric layer 406. Various processes may be used to form the sidewall spacers 408, in one embodiment, the sidewall spacers 408 may be formed by forming a sidewall spacer material layer on the semiconductor substrate 401 and the annular gate 407, and around the annular gate 407 and the annular gate dielectric layer 406; and performing an etch back process to remove the sidewall spacer material layer on the semiconductor substrate 401 and the annular gate 407. Thus, the sidewall spacers 408 on the side surfaces of the annular gate 407 and the annular gate dielectric layer 406 may be formed.

The sidewall spacer material layer may be made of any appropriate material, such as silicon oxide, silicon nitride, or silicon oxynitride, etc. The sidewall spacers 408 may be also stacked layers made of different materials. Various processes may be used to form the sidewall spacer material layer, such as a CVD process, a PVD process, or an ALD process, etc. The etch back process may be a dry etching process, or a wet chemical etching process, etc.

Figure 24:
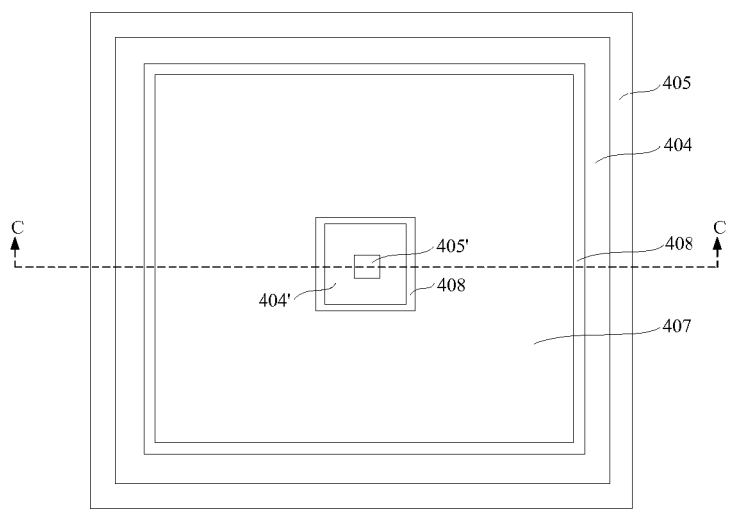

Returning to FIG. 27, after forming the sidewall spacers 408, a source region and a drain region may be formed (S105). FIG. 24 illustrates a corresponding semiconductor structure; and FIG. 25 illustrates a cross-section view of the semiconductor structure illustrated in FIG. 24 along the C-C direction.

Figure 25:
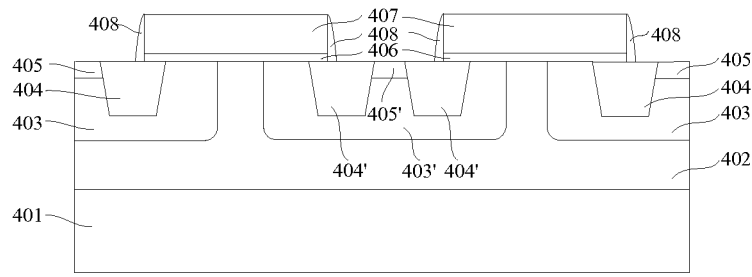

As shown in FIG. 24 and FIG. 25, a drain region 405' is formed in the first drifting region 403' at the inner side of the first annular isolation structure 404', and a source region 405 is formed in the second drifting region 403 at the outer side of the second isolation structure 404. Thus, the source region 405 is an annular shape. The annular source region 405 and the drain region 405' may be formed by any appropriate process, such as an ion implantation process, or an embedding method, etc.

The LDMOS transistor may include an annular gate 407, an annular source region 405 in a second annular drafting region 403 at the outer side of the annular gate 407, and a drain region 405' in a first drifting region 403' at inner side of a first annular isolation structure 404'. An annular channel may be formed between the annular source region 405 and the drain region 405'. The annular gate 407 may control the annular channel from different directions, thus the LDMOS transistor may have an enhanced channel control ability. Therefore, a short-channel effect may be effectively reduced, and the drive current may be increased. Further, the LDMOS transistor may occupy less area of a chip under a same drive current, thus the production cost may be reduced.

Thus, an LDMOS transistor may be formed by the above disclosed processes and methods, the corresponding transistor is illustrated in FIG. 24; and FIG. 25 illustrates a cross-section view of the LDMOS transistor shown in FIG. 24. The LDMOS transistor includes a semiconductor substrate 401 having a well region 402, at least one first drifting region 403' and at least one second drifting region 403 in the well region 402. The LDMOS transistor also includes an annular source region 405 in the second drifting region 403, an annular gate dielectric layer 406 and an annular gate 407. Further, the LDMOS transistor includes a first annular isolation structure 404' in the first drifting region 403' at the inner side of the annular gate dielectric layer 406. Further, the LDMOS transistor also includes sidewall spacers 408 around the annular gate dielectric layer 406 and the annular gate 407, and a drain region 405' in the first drifting region 403' at the inner side of the first annular isolation structure 404'. The detailed structures and intermediate structures are described above with respect to the fabrication methods.

Figure 26:
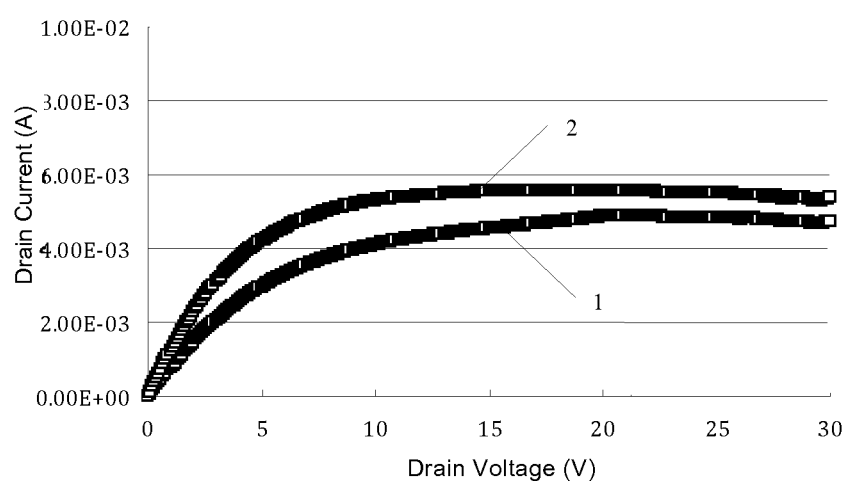
FIG. 26 illustrates a comparison of I-V curves between the existing N-type LDMOS and the LDMOS transistor fabricated by a disclosed embodiment.

FIG. 26 illustrates a comparison of I-V curves between the existing N-type LDMOS and an N-type LDMOS transistor fabricated by a disclosed embodiment. The I-V curves may be obtained by a simulation.

As shown in FIG. 26, the lateral axis represents drain voltages, and the vertical axis represents drain currents. Curve 1 illustrates an I-V curve of the existing N-type LDMOS; and curve 2 illustrates an I-V curve of the N-type LDMOS transistor fabricated by a disclosed embodiment.

As shown in FIG. 26, a drain current of the N-type LDMOS transistor fabricated by a disclosed embodiment is greater than a drain current of the existing N-type LDMOS transistor under a same drain voltage. That is, a drive current of the N-type LDMOS transistor fabricated by the disclosed embodiment is greater than a drive current of the existing N-type LDMOS transistor. Thus, the N-type LDMOS transistor fabricated by the disclosed embodiment may occupy a smaller area of a chip than the existing N-type LDMOS transistor under a same drive current, the production cost may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A lateral double diffusion metal-oxide-semiconductor transistor, comprising:
    a semiconductor substrate having a well region;
    at least one drifting region in the well region;
    a drain region in the drifting region;
    an annular gate dielectric layer on the well region and surrounding the drain region in the substrate;
    an annular gate on the annular gate dielectric layer, the annular gate surrounding the drain region in the substrate;
    at least one annular isolation structure in the drifting region and surrounding the drain region;
    an annular source region in the well region surrounding the drain region and surrounding at least one annular isolation structure;
    an annular lightly doped region in the well region at an outer side of the annular gate, the annular lightly doped region including the annular source region; and
    an annular channel region formed between the drain region and the annular source region,
    wherein:
    the annular lightly doped region and the drifting region are in the well region and separated by a distance in the well region;
    the drifting region and an edge of an inner side of the annular gate have an overlap along a direction vertical to a top surface of the semiconductor substrate;
    the at least one annular isolation structure includes a first annular isolation structure formed in a first drifting region at an inner side of the annular gate, and a second annular isolation structure formed in a second drifting region at an outer side of the annular gate, the second annular isolation structure surrounding the first annular isolation structure; and
    a most outer annular isolation structure and one side of the annular gate have an overlap along a direction vertical to the top surface of the semiconductor substrate.

2. The double diffusion metal-oxide-semiconductor transistor according to claim 1, further including:
    sidewall spacers surrounding the annular gate dielectric layer and the annular gate, wherein:
    an annular overlap is formed between the sidewall spacers and the semiconductor substrate along the direction vertical to the top surface of the semiconductor substrate.

3. The double diffusion metal-oxide-semiconductor transistor according to claim 2, wherein:
    a depth of the annular lightly doped region is equal to, or greater than a depth of the annular source region.

4. The double diffusion metal-oxide-semiconductor transistor according to claim 1, further including:
    at least three annular isolation structures.

5. The double diffusion metal-oxide-semiconductor transistor according to claim 1, wherein:
    the at least one annular isolation structure includes a shallow trench isolation structure, or a field oxidation isolation structure.

6. The double diffusion metal-oxide-semiconductor transistor according to claim 1, wherein:
    the drifting region in the semiconductor substrate includes at least a first drifting region and a second drifting region;
    the first drifting region includes the drain region; and
    the second drifting region includes the annular source region.

7. A lateral double diffusion metal-oxide-semiconductor transistor, comprising:
    a semiconductor substrate having a well region;
    at least one drifting region in the well region;
    a source region in the well region;
    an annular gate dielectric layer on the well region and surrounding the source region in the substrate;
    an annular gate on the annular gate dielectric layer, the annular gate surrounding the source region;
    at least one annular isolation region in the drifting region and surrounding the source region;
    an annular drain region in the well region surrounding the source region and surrounding the at least one annular isolation structure;
    a lightly doped region in the well region at an inner side of the annular gate dielectric layer; and an annular channel region formed between the source region and the annular drain region, wherein:
the lightly doped region and the drifting region are in the well region and are separated by a distance in the well region;
the drifting region and an edge of an outer side of the annular gate have an overlap along a direction vertical to a top surface of the semiconductor substrate; and
a most outer annular isolation structure and the outer side of the annular gate have an overlap along a direction vertical to the top surface of the semiconductor substrate.

8. The lateral double diffusion metal-oxide-semiconductor transistor according to claim 7, further including:
sidewall spacers surrounding the annular gate dielectric layer and the annular gate, wherein:
an annular overlap is formed between the sidewall spacers and the semiconductor substrate along a direction vertical to the top surface of the semiconductor substrate.

9. The lateral double diffusion metal-oxide-semiconductor transistor according to claim 8, wherein:
a depth of the lightly doped region is equal to, or greater than a depth of the source region.

10. The lateral double diffusion metal-oxide-semiconductor transistor according to claim 7, wherein:
the at least one annular isolation structure includes a shallow trench isolation structure, or a field oxidation isolation structure.

11. A method for forming a lateral double diffusion metal-oxide-semiconductor transistor, comprising:
providing a semiconductor substrate;
forming a well region in the semiconductor substrate;
forming at least one annular isolation structure and at least one drifting region in the well region;
forming an annular gate dielectric layer on the well region;
forming an annular gate on the annular gate dielectric layer; and
forming a source region and a drain region, wherein:
one of the source region and the drain region includes an annular structure to form an annular channel region between the one of the drain region and the source region having the annular structure and the other of the drain region and the source region; and
the one of the source region and the drain region and the at least one drifting region are in the well region and separated by a distance in the well region.

12. The method according to claim 11, wherein forming a source region and a drain region further includes:
forming an annular source region in the well region at an outer side of the annular gate dielectric layer; and
forming the drain region in the drifting region at an inner side of the annular isolation structure.

13. The method according to claim 11, wherein forming a source region and a drain region further includes:
forming an annular drain region in the drifting region at an outer side of the annular isolation structure; and
forming the source region in the well region at an inner side of the annular gate.

14. The method according to claim 11, wherein forming a source region and a drain region further includes:
forming an annular source region in a most outside drifting region at an outer side of a most outside annular isolation structure; and
forming a drain region in a most inside drifting region at an inner side of a most inside annular isolation structure.

15. The method according to claim 11, after forming an annular gate, further including:
forming a lightly doped region in the well region; and
forming sidewall spacers around the annular gate dielectric layer and the annular gate.

16. The method according to claim 15, wherein:
the lightly doped region is formed by an ion implantation process.

17. The method according to claim 11, wherein:
the at least one drifting region includes a first drifting region including the drain region, and a second drifting region including an annular source region;
the at least one annular isolation structure includes a first annular isolation structure and a second annular isolation structure, the second annular isolation structure surrounding the first annular isolation structure;
the first annular isolation structure is formed in the first drifting region at an inner side of the annular gate; and
the second annular isolation structure is formed in the second drifting region at an outer side of the annular gate.

18. The method according to claim 17, wherein:
the second drifting region is an annular drifting region.

19. The method according to claim 11, wherein:
the annular gate dielectric layer is made of silicon oxide; and
the annular gate is made of poly silicon.

* * * * *